United States Patent
Yong et al.

(10) Patent No.: US 7,250,350 B2
(45) Date of Patent: Jul. 31, 2007

(54) METHOD AND STRUCTURE FOR INTEGRATED STACKED CAPACITOR FORMATION

(75) Inventors: Liu Yong, Shanghai (CN); Cui Yin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 92 days.

(21) Appl. No.: 10/927,730

(22) Filed: Aug. 27, 2004

(65) Prior Publication Data

US 2005/0287757 A1    Dec. 29, 2005

(51) Int. Cl.
  *H01L 21/20* (2006.01)
(52) U.S. Cl. .............. 438/398; 257/296; 257/301; 257/302
(58) Field of Classification Search .......... 257/296, 257/301, 302; 438/243, 255, 386, 398
  See application file for complete search history.

(56) References Cited

U.S. PATENT DOCUMENTS

| | | | |
|---|---|---|---|
| 5,956,587 A * | 9/1999 | Chen et al. | 438/255 |
| 6,177,308 B1 * | 1/2001 | Lou | 438/253 |
| 6,589,837 B1 * | 7/2003 | Ban et al. | 438/239 |
| 2003/0162361 A1 * | 8/2003 | Coursey | 438/398 |

* cited by examiner

*Primary Examiner*—William David Coleman
*Assistant Examiner*—Su C. Kim
(74) *Attorney, Agent, or Firm*—Townsend and Townsend and Crew LLP

(57) ABSTRACT

An integrated circuit device structure (and methods). The structure includes a semiconductor substrate comprising a surface. A first doped polysilicon liner is defined within a first trench region formed on a first plug coupled to the surface of the substrate and a second doped polysilicon liner is defined within a second trench region on a second plug coupled to the surface of the substrate. The first trench region is separated from the second trench region by a predetermined dimension. The structure also has a first rugged polysilicon material overlying surfaces of the first doped polysilicon material within the first trench region and a second rugged polysilicon material overlying surfaces of the second doped polysilicon material in the second trench region. The first rugged polysilicon material is free from a possibility of electrical contact with the second rugged polysilicon material. An organic material is disposed completely within the first doped polysilicon liner and disposed completely within the second doped polysilicon liner to protect the first rugged polysilicon material and the second rugged polysilicon material overlying the respective surfaces of the first doped polysilicon liner and the second doped polysilicon liner.

10 Claims, 17 Drawing Sheets

1603

| CONVENTIONAL FLOW | | | INVENTION FLOW | | |
|---|---|---|---|---|---|
| STEP SEQ | STEP DESCRIPTION | FIGURE | STEP SEQ | STEP DESCRIPTION | FIGURE |
| 1 | SiN Deposition | 1 | 1 | SiN Deposition | 19 |
| 2 | HDP HDP-SiO Deposition | | 2 | HDP HDP-SiO Deposition | |
| 3 | CMP Polishing | | 3 | CMP Polishing | |
| 4 | SiN CAP SiN Deposition | | 4 | SiN CAP SiN Deposition | |
| 5 | SiN CAP P-SiN Deposition | 2 | 5 | BPSG Deposition | 20 |
| 6 | Photo | | 6 | BPSG Reflow | |
| 7 | ET1 Etch | | 7 | Trench Photo | 21 |
| 8 | DAS Deposition | 3 | 8 | Trench Etch | |
| 9 | DAS ETBK Etch | 4 | 9 | DAS Deposition | 22 |
| 10 | ET2 Etch | 5 | 10 | VIA Etch | 23 |
| 11 | DAS Deposition | 6 | 11 | DEP | 24 |
| 12 | DAS CMP Polishing | 7 | 12 | poly CMP | 25 |
| 13 | PESIN RECESS | 8 | 13 | poly Photo | 26 |
| 14 | BPSG Deposition | 9 | 14 | poly Etch | |
| 15 | BPSG Reflow | | 15 | RGPO DEP | 27 |
| 16 | Photo | 10 | 16 | RGPO PR Coating | 28 |
| 17 | Etch | | 17 | RGPO CMP Polishing | 29 |
| 18 | DAS Deposition | 11 | 18 | RGPO BPSG RECESS | 30 |
| 19 | RGPO RDAS Deposition | 12 | 19 | RGPO PR STRIP | 31 |
| 20 | RGPO PR Coating | 13 | 20 | RGPO RDAS DOPING PH3 Doping | |
| 21 | RGPO CMP Polishing | 14 | 21 | ONO SiN DEP Deposition | 32 |
| 22 | RGPO PR STRIP | 15 | 22 | ONO Oxidation | |
| 23 | RGPO BPSG RECESS | 16 | 23 | DAS Deposition | 33 |
| 24 | RGPO RDAS DOPING PH3 Doping | 17 | | | |
| 25 | ONO SiN DEP Deposition | | | | |
| 26 | ONO Oxidation | | | | |
| 27 | DAS Deposition | 18 | | | |

FIGURE 34

METHOD AND STRUCTURE FOR INTEGRATED STACKED CAPACITOR FORMATION

CROSS-REFERENCES TO RELATED APPLICATIONS

This application claims priority to Chinese Patent Application No. 200410025740.7, filed on Jun. 28, 2004, and incorporated herein by this reference.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits and their processing for the manufacture of semiconductor devices. More particularly, the invention provides a method and device for manufacturing a stack capacitor of a dynamic random access memory device, commonly called DRAMs, but it would be recognized that the invention has a much broader range of applicability. For example, the invention can be applied to other devices having stack capacitor designs.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of capacitor structure for memory devices. Such capacitor structures include, among others, trench capacitor and stack capacitor designs. Although there have been significant improvements, such designs still have many limitations. As merely an example, these designs must become smaller and smaller but still require large voltage storage requirements. Additionally, these capacitor designs are often difficult to manufacture and generally require complex manufacturing processes and structures, which lead to inefficiencies and may cause low yields. These and other limitations will be described in further detail throughout the present specification and more particularly below.

From the above, it is seen that an improved technique for processing semiconductor devices is desired.

BRIEF SUMMARY OF THE INVENTION

According to the present invention, techniques including methods for the manufacture of semiconductor devices are provided. More particularly, the invention provides a method and device for manufacturing a stack capacitor of a dynamic random access memory device, commonly called DRAMs, but it would be recognized that the invention has a much broader range of applicability. For example, the invention can be applied to other devices having stack capacitor designs.

In a specific embodiment, the invention provides a method of forming a semiconductor integrated circuit memory device. The method includes forming a first opening and a second opening in a dielectric material. The first opening is separated from the second opening by a thickness of predetermined dimension of the dielectric material and a surface region defined overlying the thickness of the predetermined dimension. To better characterize the structure, an aspect ratio can be defined as the ratio between the width of the trench opening and the thickness of predetermined dimension of dielectric material. The method also includes forming a liner of doped polysilicon material within the first opening and the second opening to define a first doped polysilicon liner within the first opening and to define a second doped polysilicon liner within the second opening. The method forms hemispherical grained silicon (herein "HSG") overlying surfaces of the doped polysilicon material in the first opening and the second opening and overlying the surface region defined overlying the thickness of the predetermined dimension. A step of filling the first opening and the second opening with an organic material to protect the HSG overlying the surfaces including the surface region is also included. The method planarizes the organic material to remove the HSG on the surface region defined overlying the thickness of the predetermined dimension to substantially prevent a possibility of electrical contact between the first doped polysilicon liner in the first opening and the second doped polysilicon liner in the second opening. The method removes the thickness of dielectric material between the first opening and the second opening, while maintaining the organic material in the first opening and the second opening to protect the HSG material defined therein. A step of removing the organic material from the first opening and the second opening also is included.

In an alternative specific embodiment, the invention provides a method of forming a semiconductor integrated circuit memory device. The method includes forming a first opening and a second opening in a dielectric material. The first opening is separated from the second opening by a thickness of predetermined dimension of the dielectric material and a surface region defined overlying the thickness of the predetermined dimension. The method forms a liner of doped polysilicon material within the first opening and the second opening to define a first doped polysilicon liner within the first opening and to define a second doped polysilicon liner within the second opening. The method also forms HSG overlying surfaces of the doped polysilicon material in the first opening and the second opening and overlying the surface region defined overlying the thickness of the predetermined dimension. A step of filling the first opening and the second opening with an organic material to protect the HSG overlying the surfaces including the surface region is included. The method planarizes the organic material to remove the HSG on the surface region defined overlying the thickness of the predetermined dimension to substantially prevent a possibility of electrical contact between the first doped polysilicon liner in the first opening and the second doped polysilicon liner in the second opening. The method removes the thickness of dielectric material between the first opening and the second opening, while maintaining the organic material in the first opening and the second opening to protect the HSG material defined therein. A step of removing the organic material from the first opening and the second opening also is included.

In an alternative specific embodiment, the invention provides an integrated circuit device structure (and methods). The structure includes a semiconductor substrate comprising a surface. A first doped polysilicon liner is defined within a first trench region formed on a first plug coupled to the surface of the substrate and a second doped polysilicon liner is defined within a second trench region on a second plug coupled to the surface of the substrate. The first trench region is separated from the second trench region by a predetermined dimension. The structure also has a first rugged polysilicon material overlying surfaces of the first doped polysilicon material within the first trench region and a second rugged polysilicon material overlying surfaces of the second doped polysilicon material in the second trench region. The first rugged polysilicon material is free from a possibility of electrical contact with the second rugged polysilicon material. An organic material is disposed completely within the first doped polysilicon liner and disposed completely within the second doped polysilicon liner to protect the first rugged polysilicon material and the second rugged polysilicon material overlying the respective surfaces of the first doped polysilicon liner and the second doped polysilicon liner.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the method uses fewer masking steps as compared to conventional methods without any differences in reliability or efficiency. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 34 is a detailed list of each of the process steps illustrated by FIGS. 1 through 33.

DETAILED DESCRIPTION OF THE INVENTION

According to the present invention, techniques including methods for the manufacture of semiconductor devices are provided. More particularly, the invention provides a method and device for manufacturing a stack capacitor of a dynamic random access memory device, commonly called DRAMs, but it would be recognized that the invention has a much broader range of applicability. For example, the invention can be applied to other devices having stack capacitor designs.

For easy reading, we have provided FIG. 34 that lists each of the process steps illustrated by FIGS. 1 through 33.

Figure 1:
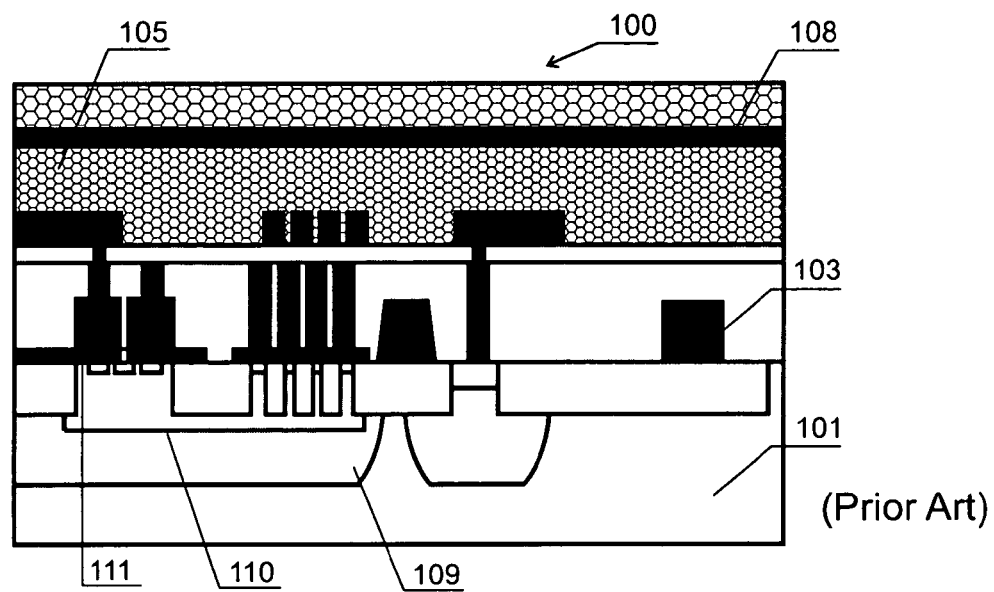
FIG. 1 is a simplified cross-sectional view diagram of a conventional integrated circuit device.
Figure 2:
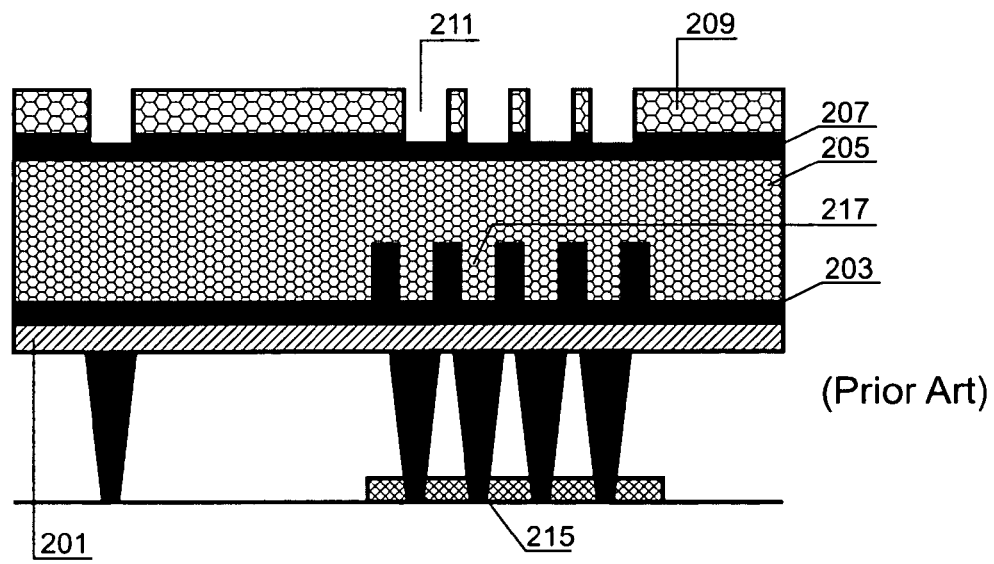
FIGS. 2-18 are simplified cross-sectional view diagrams of a conventional method for fabricating a conventional integrated circuit device.

FIG. 1 is a simplified cross-sectional view diagram of a conventional integrated circuit device 100. This diagram is merely an example, which should not unduly limit the scope of the claims herein. One of ordinary skill in the art would recognize many other variations, modifications, and alternatives. As shown, the conventional device 100 includes a plurality of layers, which form the elements of the device. A substrate 101, which is often a silicon wafer, is the starting point of the device. Well regions 109 are formed within the substrate. A memory cell 110 is also included. The memory cell includes a word line structure, bit line structures, which couple to the capacitor structure. Numerous transistor structures 103 are also included. Overlying cell region layer 111 is interconnect region 105, which includes the capacitor structure. The device also includes an overlying passivation layer 107, which is often made of a combination of oxide and nitride, such as silicon nitride and the like. Further details of a technique used to manufacture conventional capacitor structure are provided throughout the present specification and more particularly below.

A conventional method is provided as follows:
1. Form first transistor structures overlying a semiconductor substrate, including a dielectric layer defined on the transistor structures;
2. Form nitride layer;
3. Form high density plasma layer overlying nitride layer;
4. Planarize high density plasma layer;
5. Form nitride cap layer;
6. Form plasma nitride cap layer overlying nitride cap layer;
7. Mask nitride layer;
8. Etch to form openings;
9. Form plasma spacer layer;
10. Etch plasma spacer layer to form spacers on sides of openings;
11. Form openings through high density plasma using spacers as masking;
12. Form polysilicon fill layer in openings;
13. Planarize polysilicon fill layer;
14. Remove high density plasma;
15. Form BPSG layer overlying polysilicon fill layer;
16. Reflow BPSG layer;
17. Mask "(Boro PhosphoSlicate Glass)" BPSG layer;
18. Etch BPSG layer to form openings to fill layer;
19. Form polysilicon liner within opening;

20. Form rough polysilicon overlying polysilicon liner;
21. Fill opening with photoresist to protect rough polysilicon;
22. Planarize photoresist to remove rough polysilicon from BPSG;
23. Strip photoresist;
24. Remove borophosphosilicate glass (BPSG);
25. Dope exposed polysilicon;
26. Form capacitor dielectric on exposed polysilicon;
27. Form oxide layer on capacitor dielectric;
28. Form polysilicon layer overlying dielectric layer to define capacitor structure;
29. Perform other steps, as desired.

The above sequence of steps is performed to manufacture a portion of a capacitor structure for a memory cell. These steps are provided for illustrative purposes only. Details of the conventional method are provided throughout the present specification and more particularly below.

FIGS. 2-18 are simplified cross-sectional view diagrams of a conventional method for fabricating a conventional integrated circuit device. These diagrams are merely examples, which should not unduly limit the scope of the claims herein. One of ordinary skill in the art would recognize many other variations, modifications, and alternatives. Referring back to FIG. 1, the method first forms first transistor structures overlying a semiconductor substrate such as a silicon wafer. The transistor structures are configured in cells, which form memory cell regions. A dielectric layer 201 is often defined overlying the transistor structures. Such dielectric layer is often planarized using a chemical mechanical polishing process, a resist etch back process, or a combination of these techniques, and others. The method forms a nitride layer 203 overlying the dielectric layer. The nitride layer is often a thermal nitride or other substantially dense nitride layer. Often times, the nitride layer is silicon nitride, but can also be other materials or a combination of materials.

Overlying the nitride layer is a thick layer 205 of high density plasma oxide, such as PE oxide, or other suitable dielectric material. The plasma oxide serves as an inter-metal layer dielectric, which surrounds a plurality of bit line structures 217. As shown, the high density plasma layer has been planarized using a chemical mechanical polishing process, a resist etch back process, or a combination of these techniques, and others. A high density or cap nitride layer 207 is formed overlying the high density plasma layer using low pressure chemical vapor deposition processes. Overlying the nitride cap layer 207 is a plasma nitride layer 209. The method uses conventional photolithography processes to form openings 211, which align between bit line region 217 and a landing plug region 215, which couples the substrate to an upper interconnect layer or other structure.

Figure 3:
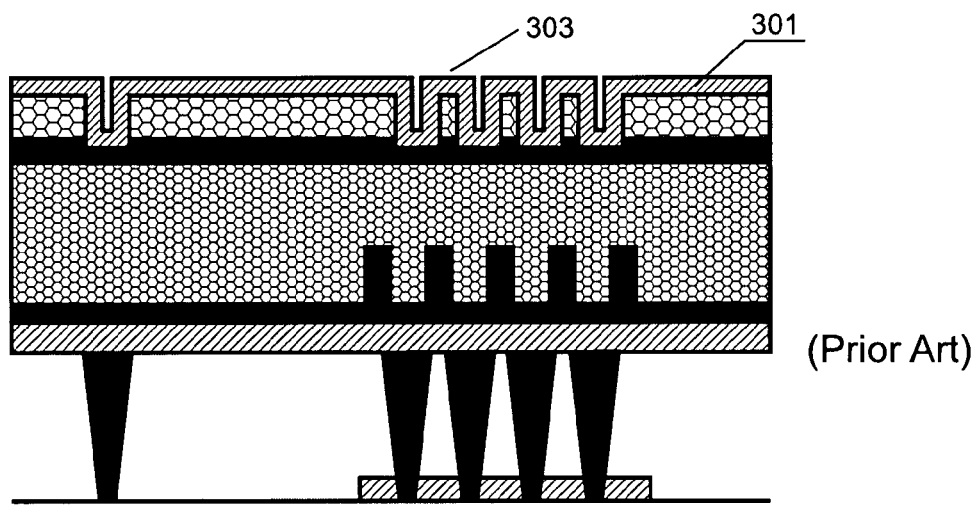
Figure 4:
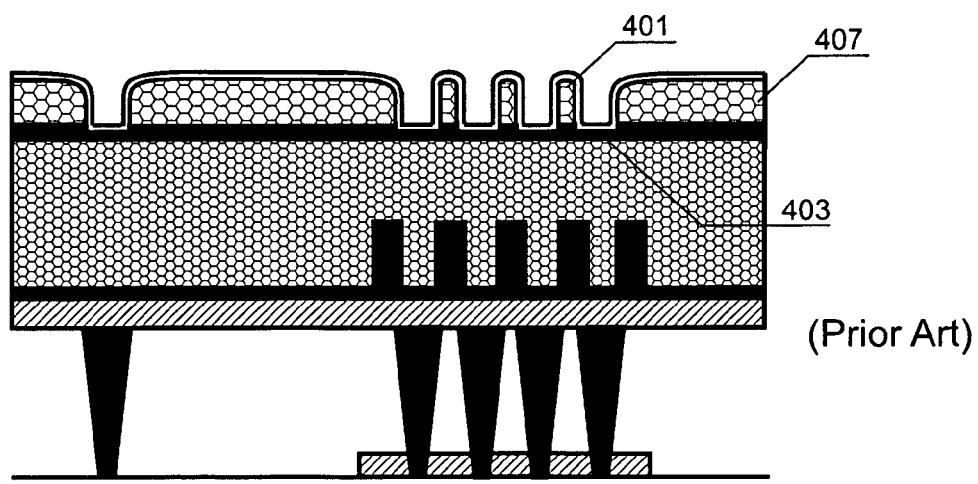
Figure 5:
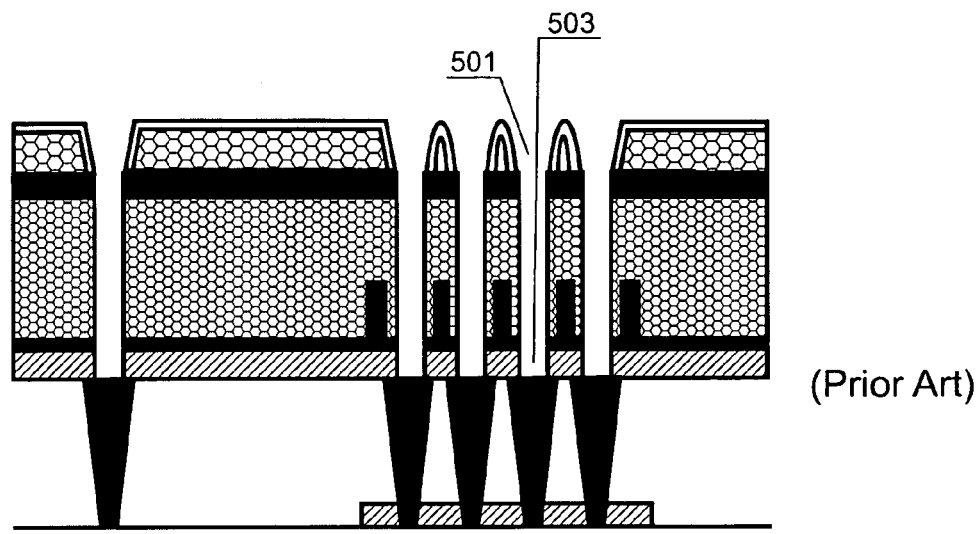

The method forms an undoped polysilicon layer 301 overlying the surfaces of the patterned nitride layer, including spacer structure 303 and opening, which aligns to underling landing plug region, as shown in FIG. 3. The spacer structure and sidewall spacers 405 are defined using an anisotropic etching process 401. The etching process exposes the surface of the plasma nitride layer 407 and removes low pressure nitride layer 403, as shown in FIG. 4. Using the sidewall spacers as a hard mask, the method continues etching through the high density plasma to form openings to expose a top portion 503 of the landing plug structure, as shown in FIG. 5. The opening forms a path from an upper surface of the plasma nitride through the low pressure nitride through the high density plasma oxide to the top portion of the landing plug structure, which clears a pathway for a contact plug.

Figure 6:
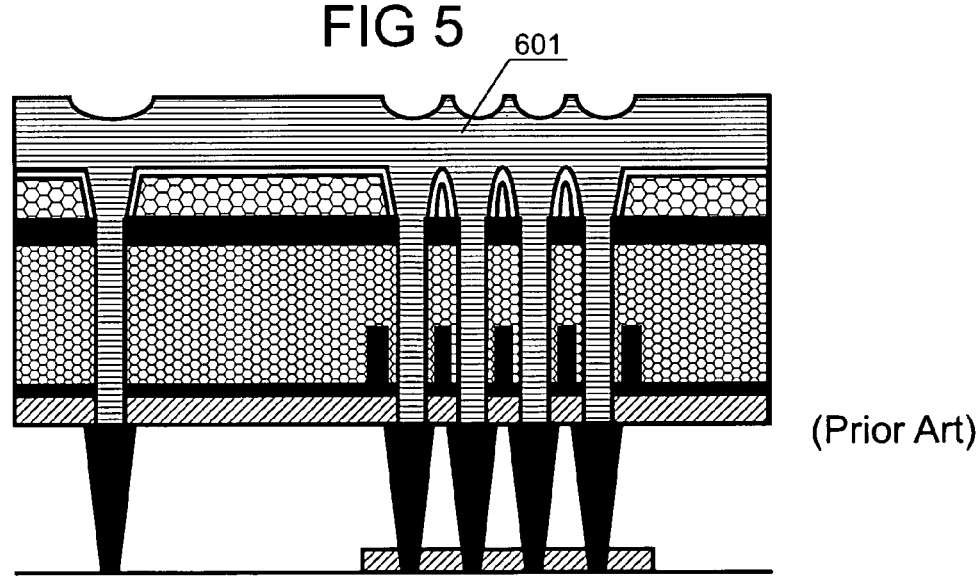
Figure 7:
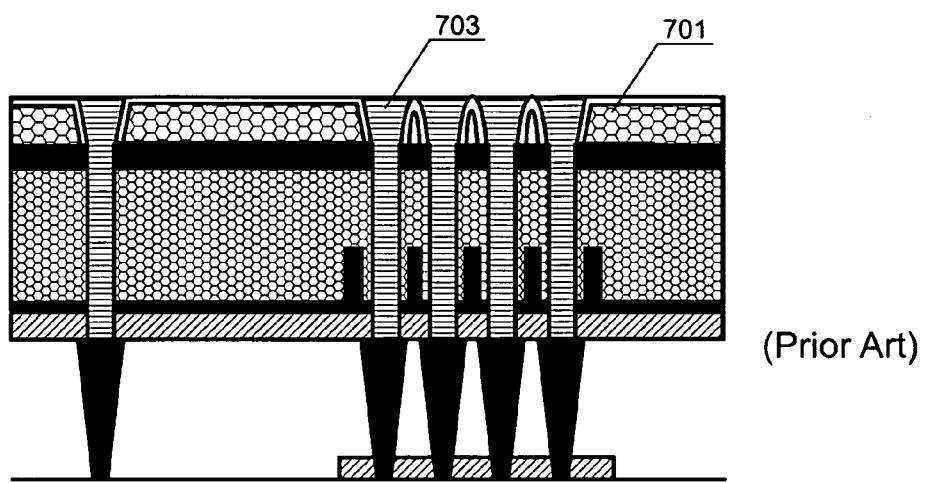
Figure 8:
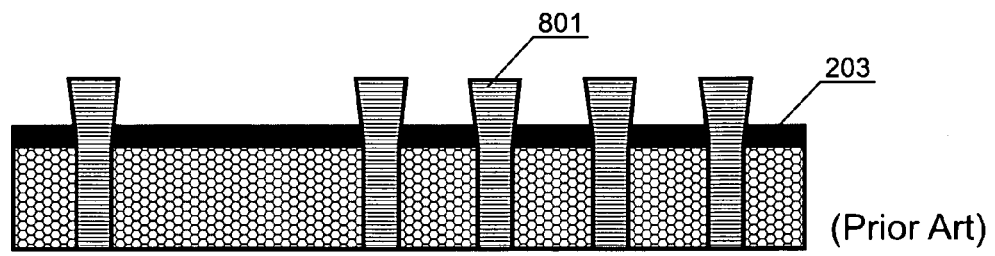
Figure 9:
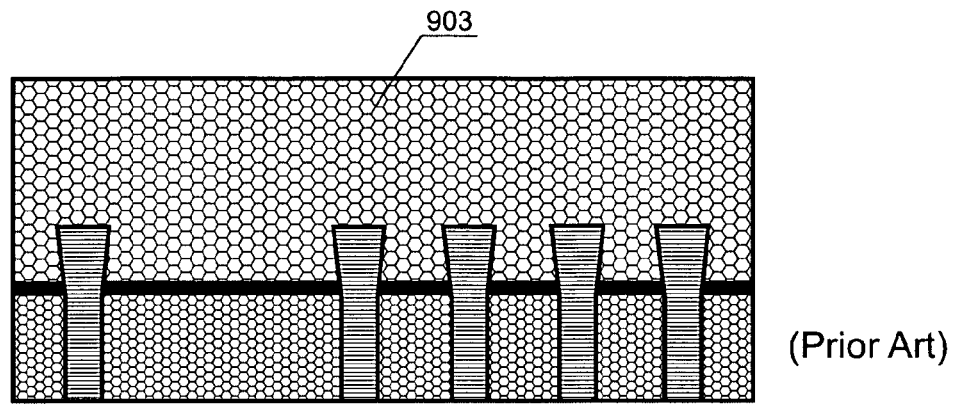

Referring to FIG. 6, the method fills each of the openings with a polysilicon material 601 to a level above the plasma nitride layer. A chemical mechanical polishing process planarizes the surface of the polysilicon and removes the polysilicon to the plasma nitride layer, as shown in FIG. 7. An upper surface 701 of the plasma nitride is exposed. The upper surface is substantially parallel to and even with the polysilicon fill material 703. The method selectively removes the plasma nitride layer to leave free standing portions 801 of the polysilicon fill material, as shown in FIG. 8. Silicon nitride layer 203 remains overlying the planarized dielectric layer. Such silicon nitride layer serves as an etch stop for the selective removal process, which is a selective removal of BPSG leaving polysilicon fill material and nitride layer intact.

Figure 10:
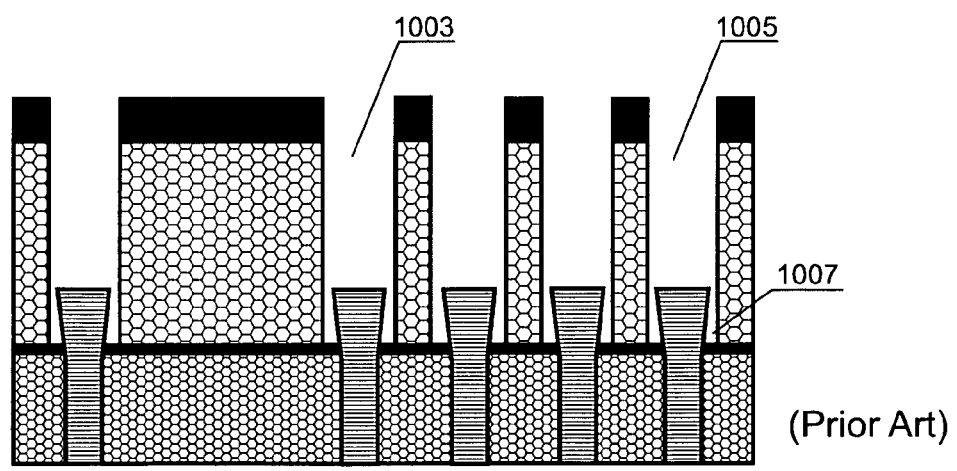

The method forms a thick inter-metal layer dielectric layer 903 overlying the free standing polysilicon fill and nitride layer. Preferably, the dielectric layer is BPSG but can also be other layers, such multiple layers and the like, as shown in the simplified diagram of FIG. 9. The BPSG layer is re-flowed for planarization or also may be planarized using another process. Referring now to FIG. 10, the method forms a masking layer 1001 overlying the dielectric layer. An opening 1003 is formed in the masking layer. An etching process is used to form via 1005, which connects to the polysilicon fill material. A gap 1007 exists between the polysilicon fill material and edges of the dielectric layer. The method forms the gap using the etching process.

Figure 11:
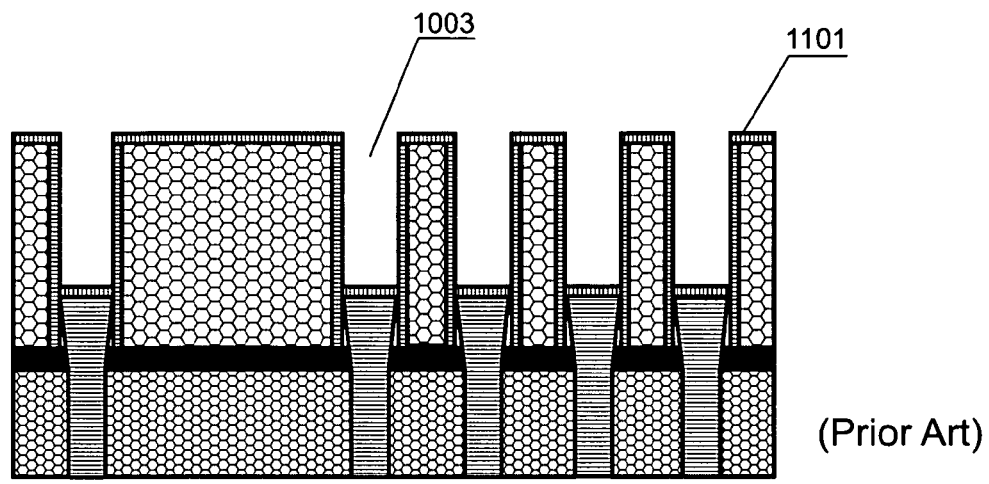
Figure 12:
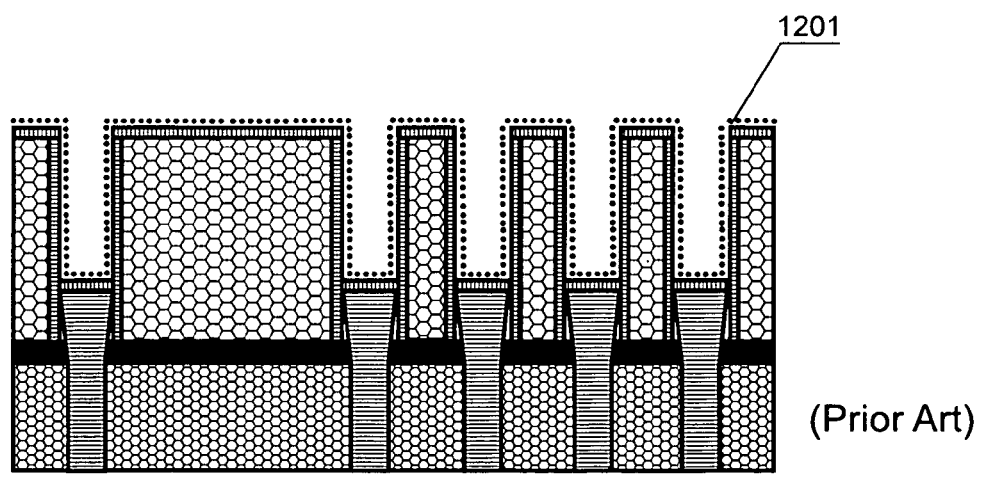
Figure 13:
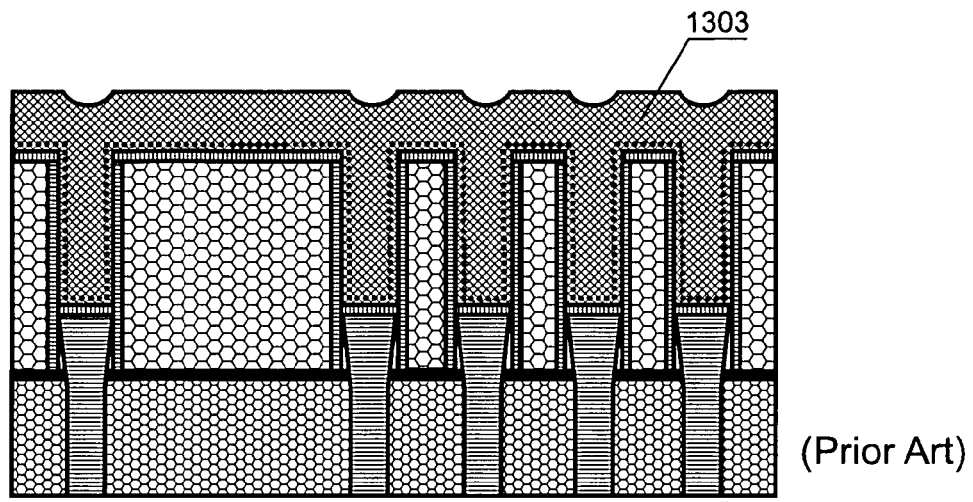
Figure 14:
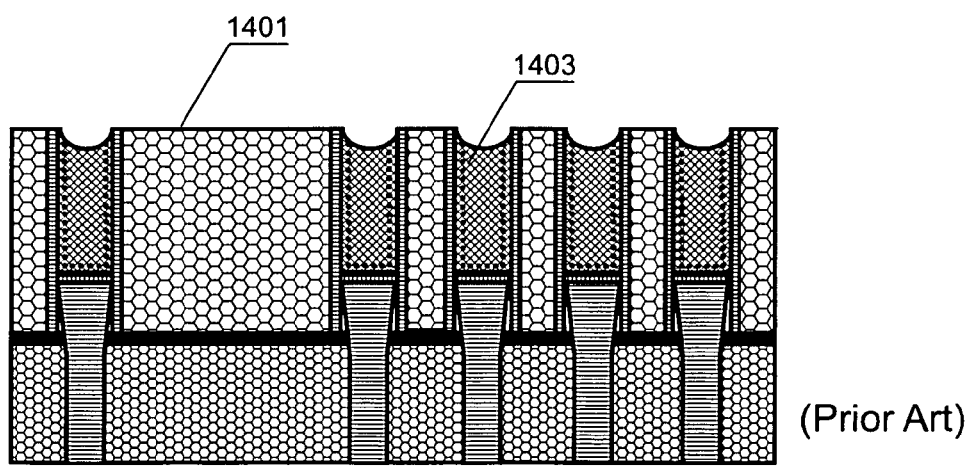
Figure 15:
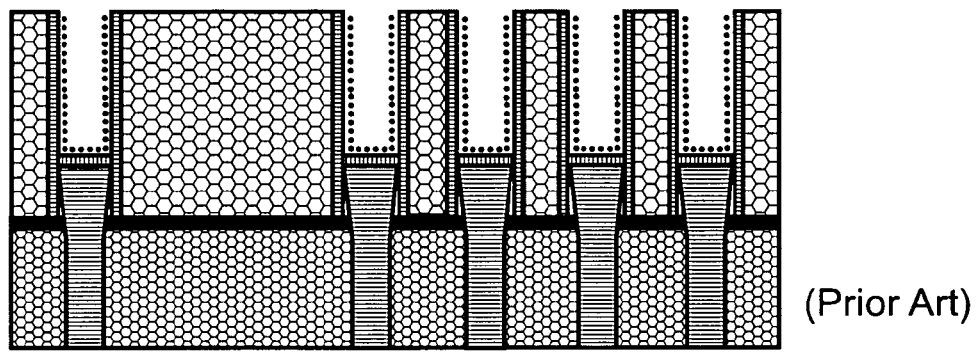

The method now forms a capacitor structure, which includes forming a polysilicon liner 1101 within each opening 1003, as shown in FIG. 11. The polysilicon liner is doped using in-situ doping, implantation, or diffusion of impurities. A layer of rough polysilicon such as hemispherical grain silicon 1201 is formed overlying exposed surfaces of the polysilicon liner, as shown in FIG. 12. To protect the rough polysilicon, the method fills the liner polysilicon, including the rough polysilicon, with an organic material, such as photoresist 1303, as shown in FIG. 13. The photoresist fills the entire opening, where it covers and protects the rough polysilicon. The photoresist fills the opening up to a level above the dielectric layer, as shown. Subsequently, the method planarizes the photoresist 1403 to expose the dielectric layer 1401, as shown in FIG. 14. Preferably, the rough polysilicon is completely removed on the surface 1401 of the dielectric layer to prevent a possibility of shorting between capacitor structures or other conductive structures. The polysilicon liner and rough polysilicon form a lower plate of a capacitor structure or other like structures.

Figure 16:
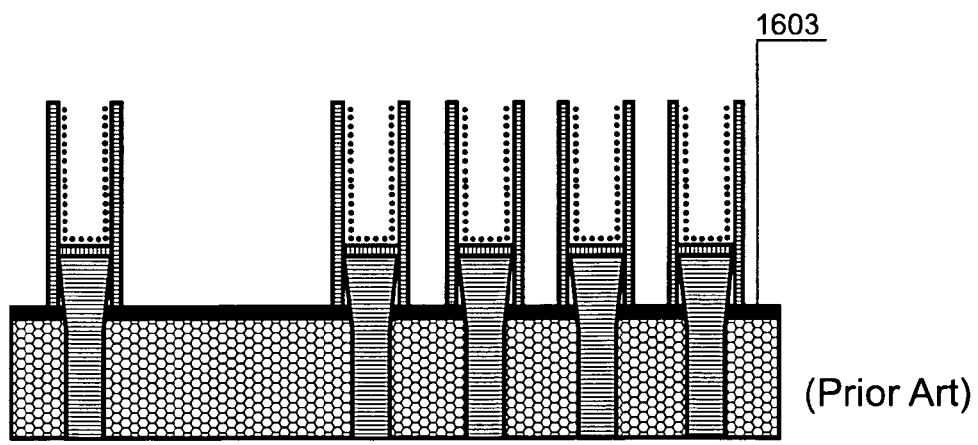
Figure 17:
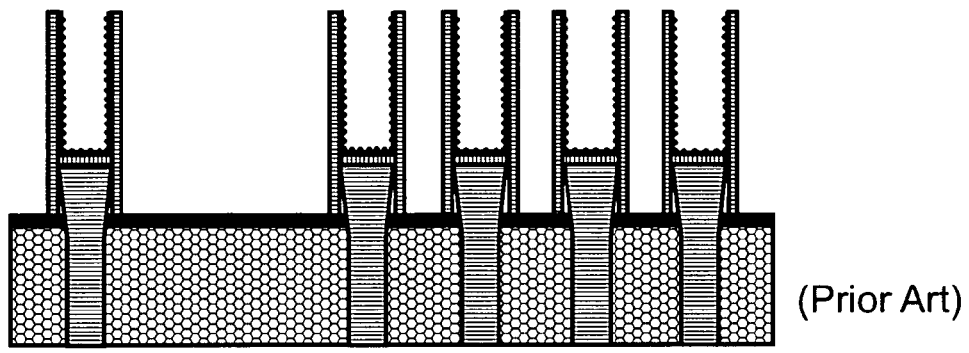
Figure 18:
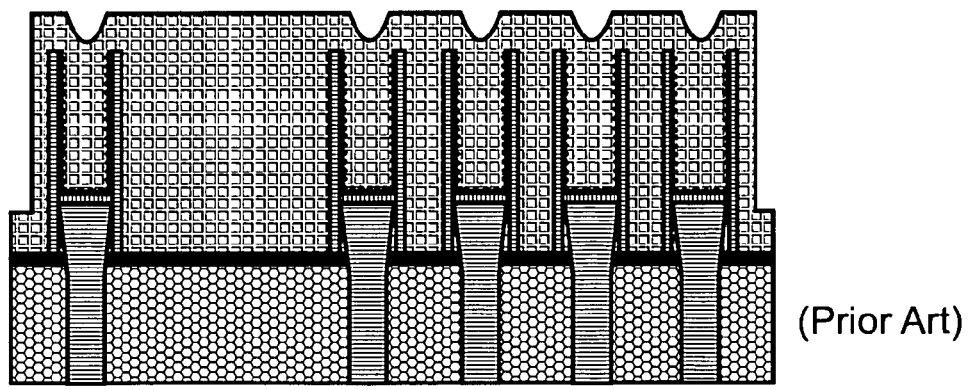

Selective etching is used to completely remove the dielectric layer surrounding the lower plate of the capacitor structure as shown by the simplified diagram of FIG. 16. The nitride layer 1603 is exposed again, which acts as an etch stop layer. To complete the capacitor structure, the method forms a capacitor dielectric overlying surfaces of the lower polysilicon plate, as shown in FIG. 17. The capacitor dielectric can include one or more layers such as an oxide-nitride-oxide ("ONO") structure or others. An upper plate made of polysilicon forms overlying the capacitor dielectric layer, as shown by FIG. 18. The conventional method of forming the capacitor structure requires many steps, which are often difficult to perform and cause efficiency limits. Many of these steps have been eliminated or reduced by way of the present invention, which has been described throughout the present specification and more particularly below.

Figure 19:
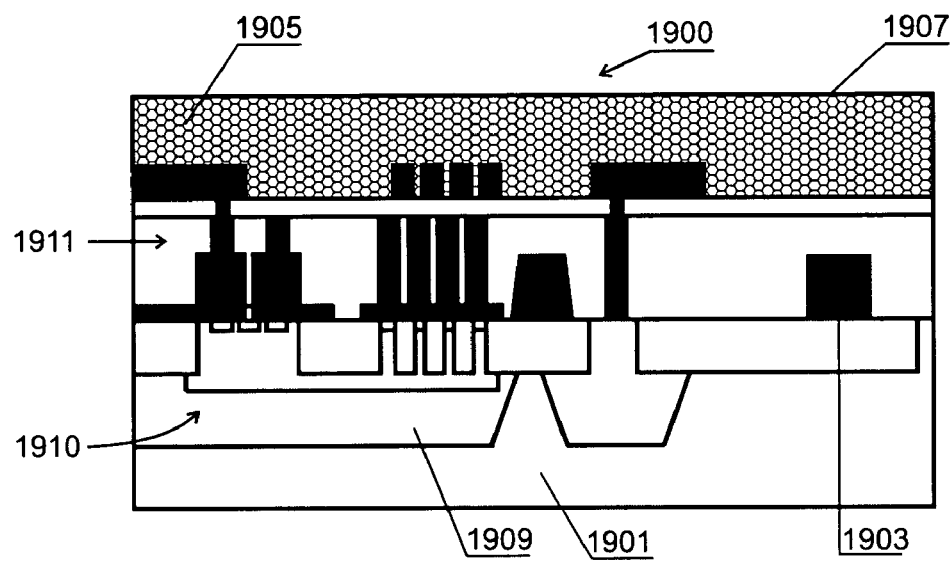
FIG. 19 is a simplified cross-sectional view diagram of an integrated circuit device according to an embodiment of the present invention.

FIG. 19 is a simplified cross-sectional view diagram of an integrated circuit device according to an embodiment of the present invention. This diagram is merely an example, which should not unduly limit the scope of the claims herein. One of ordinary skill in the art would recognize many other variations, modifications, and alternatives. As shown, the present device 1900 includes a plurality of layers, which form the elements of the device. A substrate 1901, which is often a silicon wafer, is the starting point of the device. Well regions 1909 are formed within the substrate. A memory cell 1910 is also included. The memory cell includes a word line structure, bit line structures, which couple to the capacitor structure. Numerous transistor structures 1903 are also included. Overlying cell region layer 1911 is interconnect region 1905, which includes the capacitor structure. The device also includes an overlying passivation layer 1907, which is often made of a combination of oxide and nitride, such as silicon nitride and the like. Further details of a technique used to manufacture the present capacitor structure are provided throughout the present specification and more particularly below.

A method according to an embodiment of the present invention is provided as follows:
1. Form first transistor structures overlying a semiconductor substrate, including a dielectric layer defined on the transistor structures;
2. Form nitride layer;
3. Form high density plasma layer overlying nitride layer;
4. Planarize high density plasma layer;
5. Form nitride cap layer;
6. Form BPSG layer overlying cap nitride;
7. Reflow BPSG layer;
8. Mask for trench openings;
9. Etch trench openings;
10. Form polysilicon liner in trench openings;
11. Etch through nitride layer, high density plasma layer to landing plug;
12. Form polysilicon fill layer in openings;
13. Planarize polysilicon fill layer;
14. Mask polysilicon layer;
15. Etch polysilicon layer to a vicinity slightly above the nitride stop layer;
16. Form rough polysilicon overlying polysilicon liner;
17. Fill opening with photoresist to protect rough polysilicon;
18. Planarize photoresist to remove rough polysilicon from BPSG;
19. Strip photoresist (optionally);
20. Remove BPSG;
21. Strip photoresist (preferably to protect rough polysilicon);
22. Dope exposed polysilicon;
23. Form capacitor dielectric on exposed polysilicon;
24. Form oxide layer on capacitor dielectric;
25. Form polysilicon layer overlying dielectric layer to define capacitor structure;
26. Perform other steps, as desired.

The above sequence of steps is performed to manufacture a portion of a capacitor structure for a memory cell. These steps are provided for illustrative purposes only. As shown, the present method may be performed using fewer steps than conventional methods. Additionally, the present method can also be used to protect the rough polysilicon layer before such layer is encased within the capacitor dielectric layer. These and other features of the invention are found throughout the present specification and more particularly below.

FIG. 20-33 are simplified cross-sectional view diagrams of methods according to embodiments of the present invention. These diagrams are merely examples, which should not unduly limit the scope of the claims herein. One of ordinary skill in the art would recognize many other variations, modifications, and alternatives. As shown, the method first forms first transistor structures overlying a semiconductor substrate such as a silicon wafer. The transistor structures are configured in cells, which form memory cell regions. A dielectric layer 2001 is often defined overlying the transistor structures. Such dielectric layer is often planarized using a chemical mechanical polishing process, a resist etch back process, or a combination of these techniques, and others. The method forms a nitride layer 2003 overlying the dielectric layer. The nitride layer is often a thermal nitride or other substantially dense nitride layer. Often times, the nitride layer is silicon nitride, but can also be other materials or a combination of materials. The method then forms a high density plasma oxide layer 2005 overlying the nitride layer. The oxide layer is preferably high density CVD oxide or the like.

Figure 20:
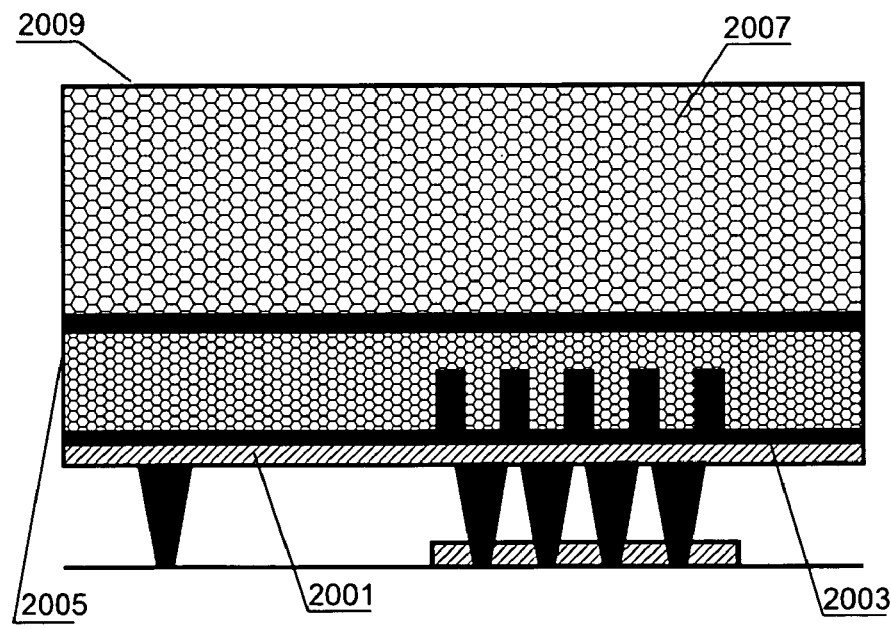
FIG. 20-33 are simplified cross-sectional view diagrams of methods according to embodiments of the present invention.
Figure 21:
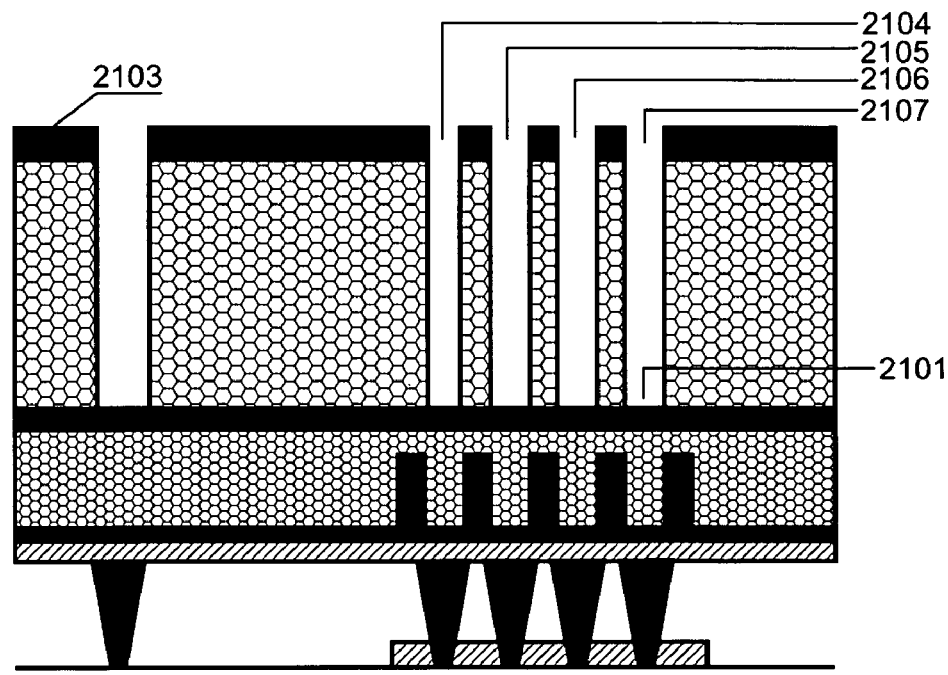

The method forms a thick inter-metal layer dielectric layer 2007 overlying the surface of the nitride layer, as shown in the simplified diagram of FIG. 20. The inter-metal layer dielectric layer is preferably a BPSG layer, PGS, and FSG, but can also be other materials. The dielectric layer is planarized 2009. In embodiments where the dielectric layer is a BPSG layer, such layer is reflowed, as shown. The method then applies a masking layer 2103 overlying the BPSG layer, which has been planarized, as shown by the simplified diagram of FIG. 21. The masking layer is processed to form a pattern or opening 2101 overlying each of the landing plug regions, each of which is between a pair of bit line structures. The opening is formed by an etching process, such as anisotropic etching, e.g., plasma etching, reactive ion etching. The opening forms a trench structure, which has a bottom region overlying the nitride layer. Such nitride layer acts as an etch stop in the present embodiment. The masking layer is stripped. In one embodiment, there should be two trench openings, depicted in FIG. 21 as a first opening 2104 and a second opening 2105, forming the basis of two charged plates of a capacitor. In another embodiment, more trenches/plates (i.e. 2101, 2102, 2103, and 2104) can be allowed for a capacitor with multiple stacks of plates, depicted in FIG. 21 as trench openings 2104, 2105, 2106, and 2107.

Figure 22:
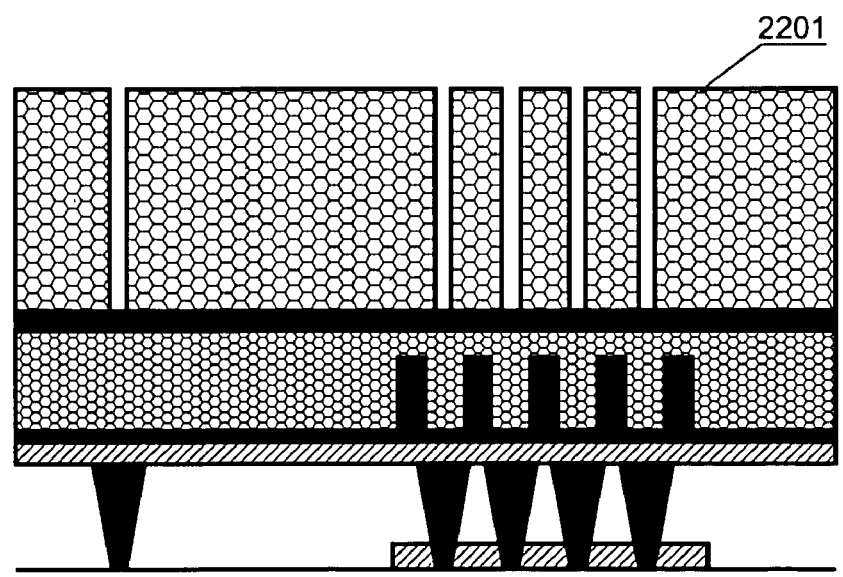
Figure 23:
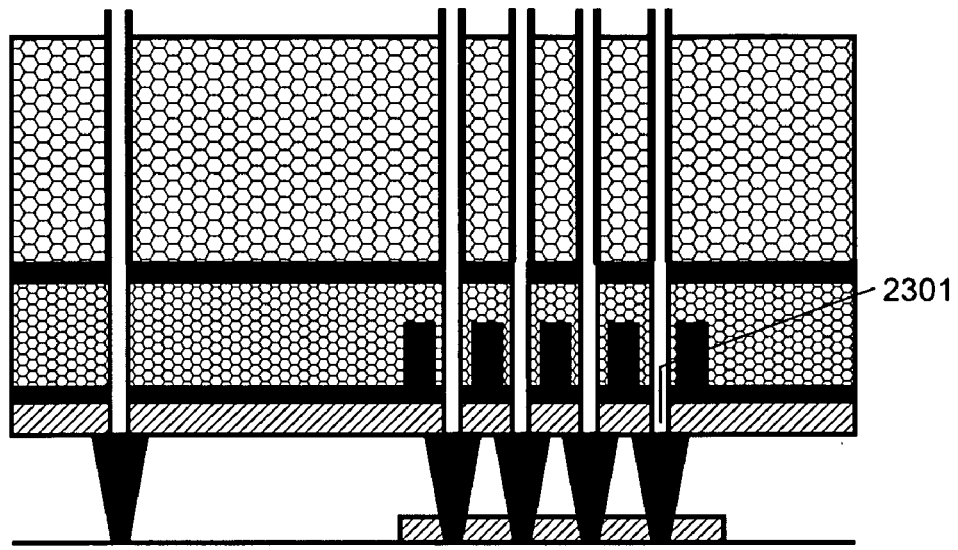
Figure 24:
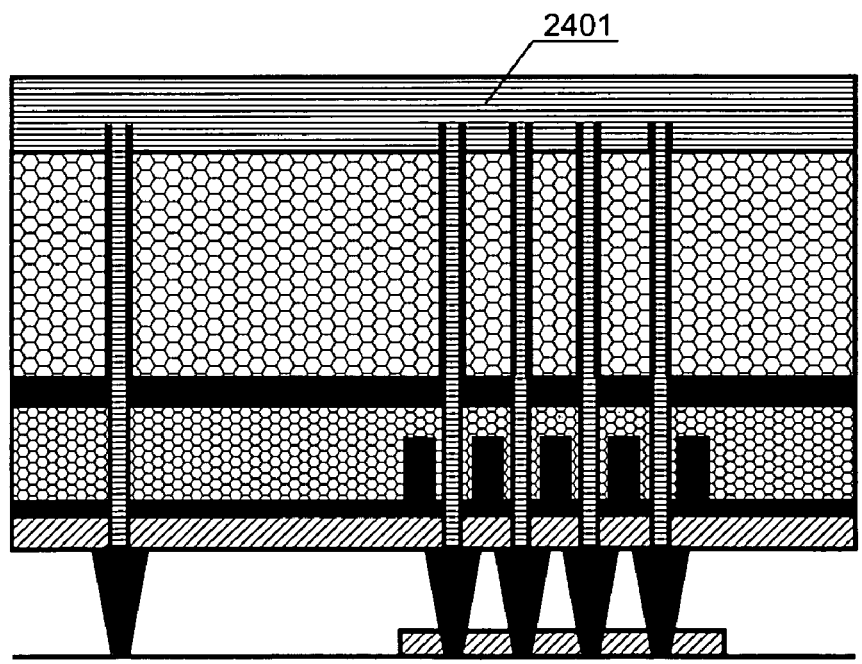
Figure 25:
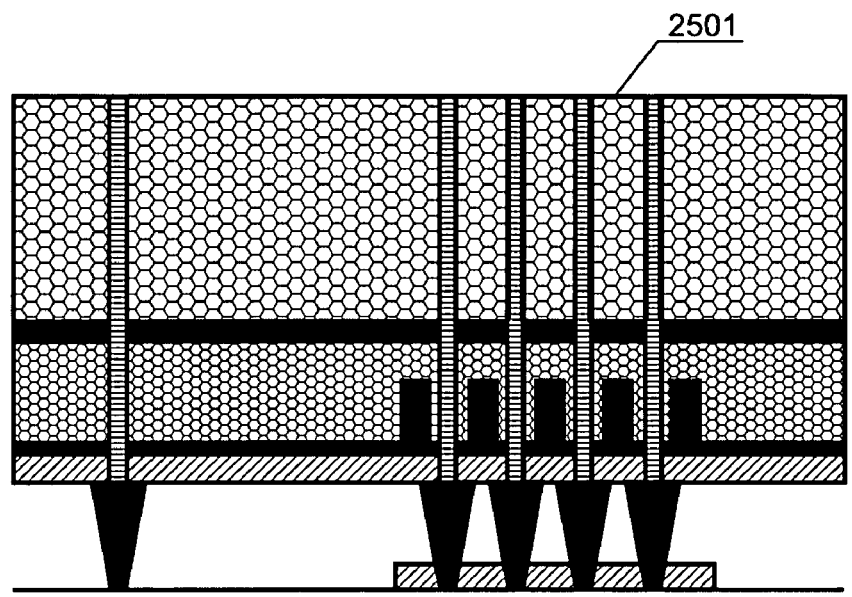

The method forms a polysilicon liner 2201 within the opening, which defines a trench structure as shown in FIG. 22. Referring now to FIG. 23, the method continues etching using the polysilicon liner as a mask through the stop layer, through the dielectric layer, to a region on top of the landing plugs. Vertical regions of the polysilicon liner act as a hard mask during the etching, which is substantially aniostropic in nature. Once the top regions 2301 of the landing plugs have been exposed, the method fills the trench region from the landing plug to a level above a vicinity of the top of the polysilicon liner with polysilicon material 2401, as shown by FIG. 24. The polysilicon material fills and overlies portions of the interlayer dielectric layer. The method planarizes the polysilicon fill layer to expose the top surface 2501 of the BPSG layer, which is substantially even with the top of the polysilicon fill layer, as shown by FIG. 25. Depending upon the application, chemical mechanical polishing, resist etchback, or other technique can be used to planarize the polysilicon fill layer.

Figure 26:
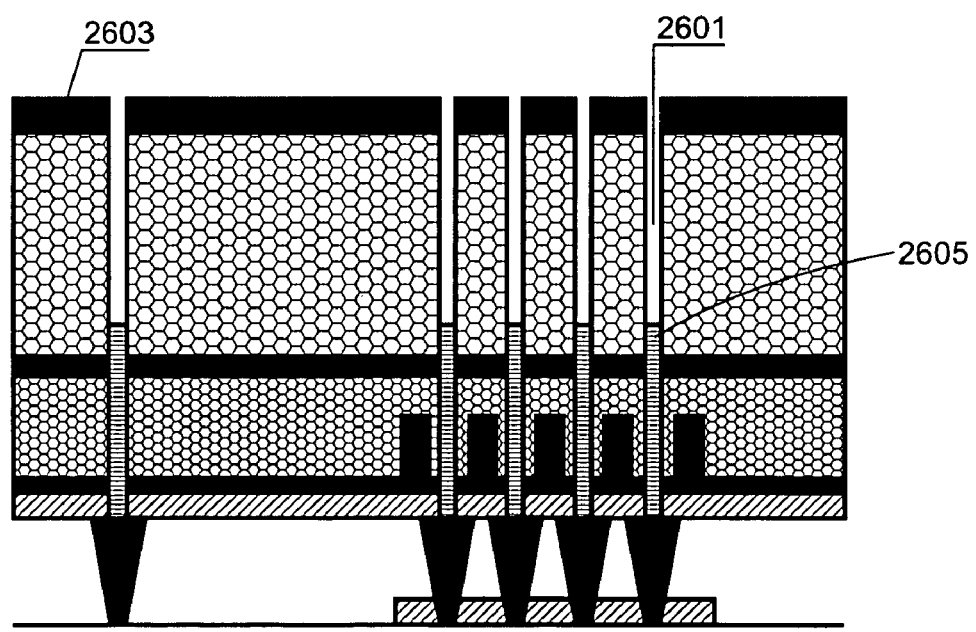
Figure 27:
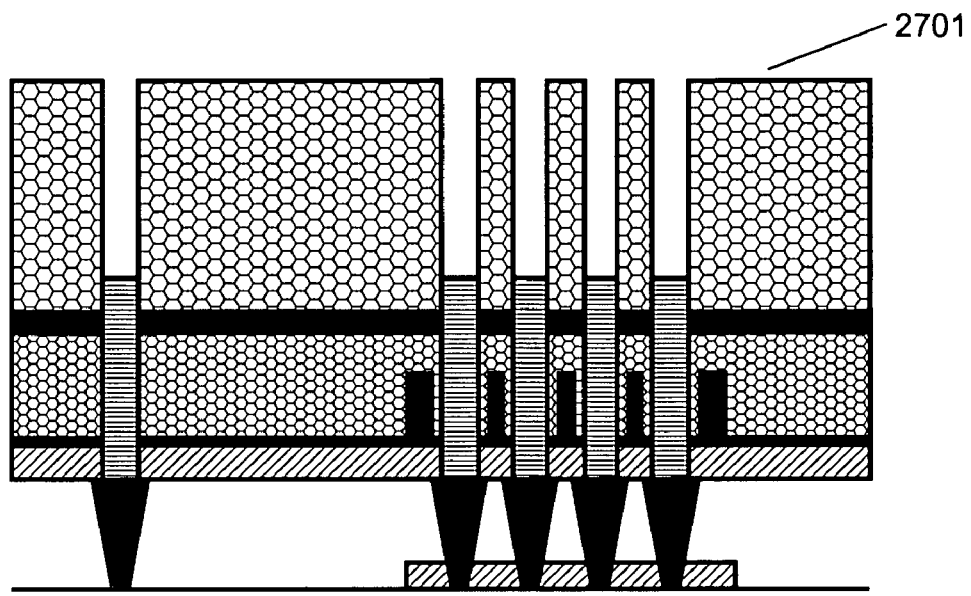

The method applies a lithography technique to form openings 2601 overlying the polysilicon fill material in the trench region, as shown by FIG. 26. Here, masking layer 2603 is formed. An etching step removes a portion of the polysilicon fill material from the upper surface of the fill material to a vicinity slightly above 2605 the nitride stop layer, as also shown. The masking layer is stripped 2701, as shown by FIG. 27. As shown, the lower plate of the capacitor structure has been formed in part.

Figure 28:
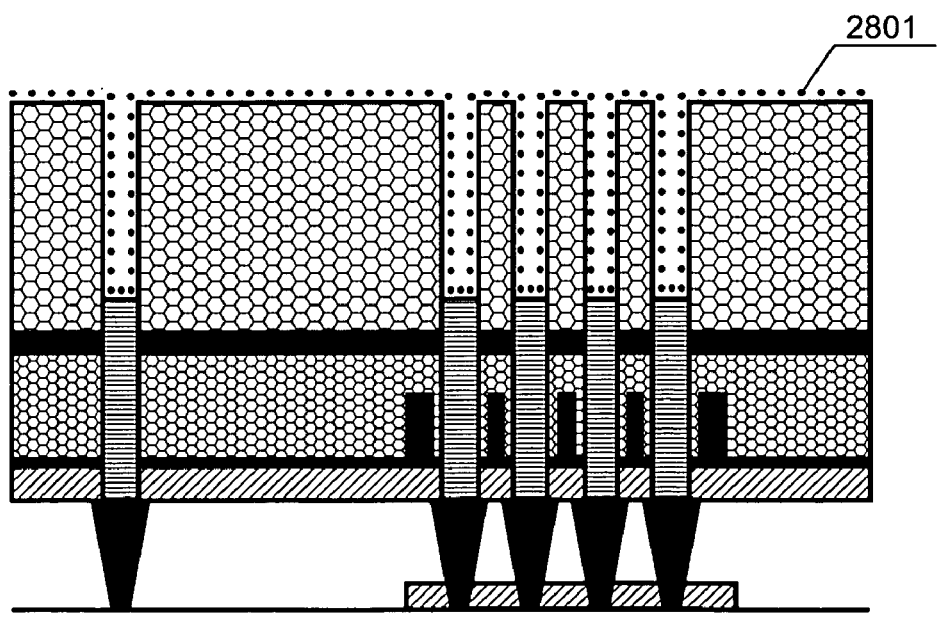
Figure 29:
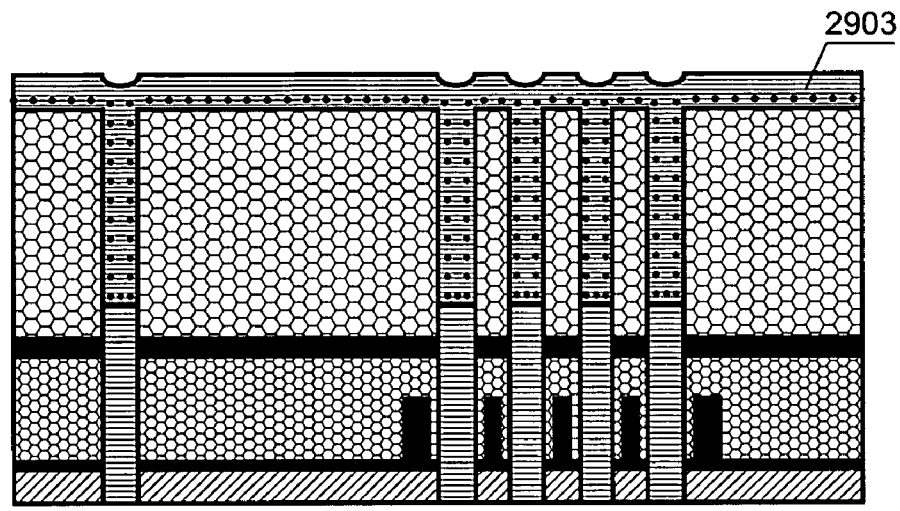

Next, a layer of rough polysilicon such as hemispherical grain (HSG) silicon 2801 is formed overlying exposed surfaces of the polysilicon liner, as shown in FIG. 28. The HSG silicon increases a surface area of the polysilicon liner in the trench region. To protect the rough polysilicon, the method fills the liner polysilicon, including the rough polysilicon, with an organic material, such as photoresist 2903, as shown in FIG. 29. The photoresist fills the entire opening, where it covers and protects the rough polysilicon and polysilicon liner. The photoresist fills the opening up to a level above the dielectric layer, as shown. Subsequently, the method planarizes the photoresist to expose the dielectric layer. Preferably, the rough polysilicon is completely removed on the surface of the dielectric layer to prevent a possibility of shorting between capacitor structures or other conductive structures. Etching techniques such as selective wet etch or plasma etch removes the rough polysilicon from the dielectric layer. The polysilicon liner and rough polysilicon form a lower plate of a capacitor structure or other like structures.

Figure 30:
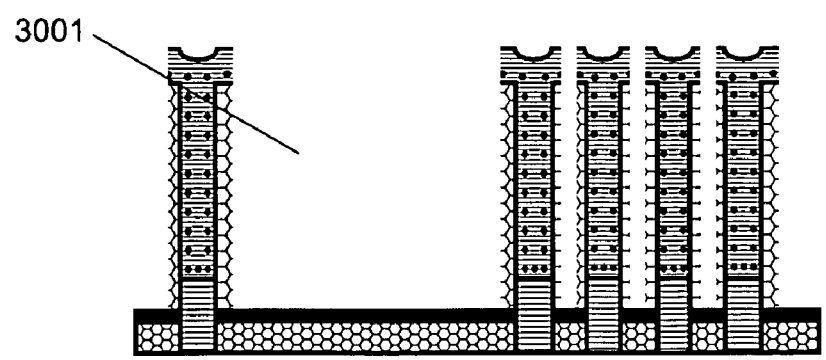
Figure 31:
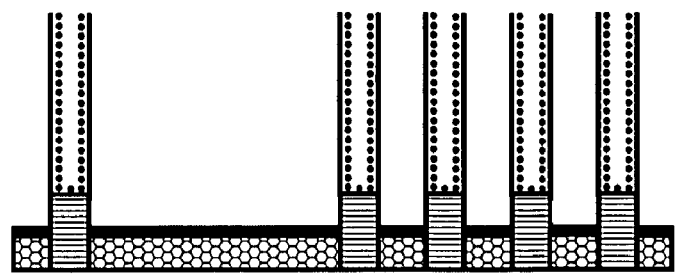

Referring to FIG. 30, the method selectively removes 3001 the BPSG material from regions surrounding the lower capacitor plate, as shown by FIG. 30. The selective removal occurs using plasma etching and/or wet etching processes. Preferably, the etching process is wet or dry using a fluorine bearing species (e.g., BOE (buffered oxide etch), BHF (buffered HF)) which are highly selective and allows for the BPSG to be etched while leaving the lower capacitor plate standing. Preferably, BOE is 1:130 (HF:NH$_4$F) To protect the rough polysilicon within the liner of the polysilicon, photoresist material still remains in the trench region. The nitride layer is exposed again, which acts as an etch stop layer.

Figure 32:
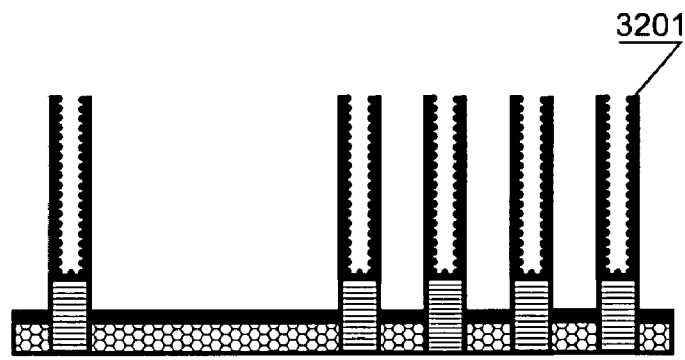
Figure 33:
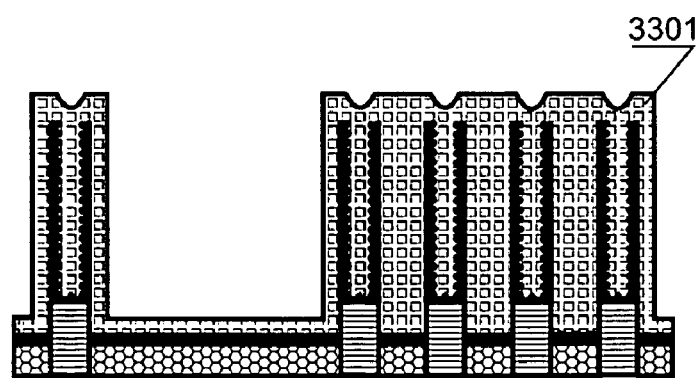

To complete the capacitor structure, the method forms a capacitor dielectric 3201 overlying surfaces of the lower polysilicon plate, as shown in FIG. 32. The capacitor dielectric can include one or more layers such as an oxide-nitride-oxide ("ONO") structure or others. An upper plate made of polysilicon 3301 forms overlying the capacitor dielectric layer, as shown by FIG. 33. Deposition techniques can be used to form the upper plate. Such deposition techniques include in-situ doped polysilicon and others. The plate is highly doped using impurities to provide a conductive region for the upper plate. Depending upon the embodiment, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing integrated circuit device memory structures, the method comprising:

forming a transistor structure overlying a semiconductor substrate, the transistor structure including a landing plug, the landing plug being coupled to a portion of the semiconductor substrate;

forming a high density plasma oxide layer overlying the transistor structure;

forming an overlying nitride layer overlying the high density plasma oxide layer;

forming a doped glass layer overlying the nitride layer, the doped glass layer having a predetermined thickness, the predetermined thickness being substantially a height of a capacitor structure;

patterning an trench opening within the doped glass layer to the nitride layer;

forming a polysilicon layer within the trench opening including sides of the trench opening and overlying a surface of the doped glass layer, the polysilicon layer having a thickness to cover sides of the trench opening;

removing a portion of the polysilicon layer overlying a bottom portion of the trench opening;

removing a portion of nitride layer and removing a portion of the high density oxide layer to form an opening overlying the landing plug while the portion of polysilicon within the sides of the opening define a width of an opening through the nitride layer and the high density oxide layer;

filling the trench opening with polysilicon material to a level above the surface of the doped glass layer; and planarizing the polysilicon material until the level of the doped glass layer is exposed, while maintaining the polysilicon material in the trench opening; and selectively removing the polysilicon material in the opening to a vicinity above the nitride layer.

2. The method of claim 1 wherein the trench opening has an aspect ratio 7 and greater.

3. The method of claim 1 further comprising forming HSG overlying exposed surfaces of the polysilicon in the trench opening.

4. The method of claim 3 further comprising filling the trench opening with photoresist material to protect the HSG in the trench opening to a level above the doped glass layer.

5. The method of claim 4 further comprising planarizing the photoresist material and remove the HSG formed at the level on the surface of the doped glass layer to separate the polysilicon material in trench opening from other capacitor structures in other trench openings.

6. The method of claim 5 further comprising removing portions of the doped glass layer surrounding the trench opening.

7. The method of claim 6 further comprising removing any remaining photoresist material from the trench opening.

8. The method of claim 1 wherein the high density oxide layer is an HDP layer.

9. The method of claim 1 wherein the overlying nitride layer is an LPCVD nitride layer.

10. The method of claim 1 wherein the transistor structure includes an MOS gate structure coupled between a first source/drain region and a second source/drain region.

* * * * *